United States Patent
Wu et al.

(10) Patent No.: US 8,908,727 B2
(45) Date of Patent: Dec. 9, 2014

(54) LASER ASSEMBLY AND METHOD FOR MANUFACTURING THE SAME

(71) Applicants: Yinan Wu, Westborough, MA (US);
Frank Ding, Milpitas, CA (US);
Vincent Nguyen, San Jose, CA (US)

(72) Inventors: Yinan Wu, Westborough, MA (US);
Frank Ding, Milpitas, CA (US);
Vincent Nguyen, San Jose, CA (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 13/832,671

(22) Filed: Mar. 15, 2013

(65) Prior Publication Data

US 2014/0269795 A1    Sep. 18, 2014

(51) Int. Cl.
*H01S 3/04* (2006.01)
*H01S 3/02* (2006.01)

(52) U.S. Cl.
CPC ..................... *H01S 3/02* (2013.01)
USPC ........................... 372/34; 372/43.01

(58) Field of Classification Search
USPC .................................. 372/34, 43.01
See application file for complete search history.

(56) References Cited

U.S. PATENT DOCUMENTS

| | | | |
|---|---|---|---|
| D396,817 S | 8/1998 | Webb | |
| D457,446 S | 5/2002 | Kallabis | |
| D461,135 S | 8/2002 | Watson et al. | |
| 6,577,388 B2 | 6/2003 | Kallabis | |
| 6,763,596 B1 | 7/2004 | Puri et al. | |
| 7,621,747 B1 | 11/2009 | Burrow | |
| 7,720,122 B2 * | 5/2010 | Matsushita et al. | 372/43.01 |
| 7,886,450 B1 | 2/2011 | Fiano | |
| D646,992 S | 10/2011 | Tuli | |
| 8,061,046 B2 | 11/2011 | Stefan et al. | |
| D668,976 S | 10/2012 | Stilz | |
| 8,467,036 B2 | 6/2013 | Gogolla et al. | |
| D692,327 S | 10/2013 | Asher et al. | |
| 2001/0025922 A1 | 10/2001 | Lautenschlager et al. | |
| 2005/0141574 A1 * | 6/2005 | Sakano et al. | 372/34 |
| 2005/0286581 A1 * | 12/2005 | Shinohara et al. | 372/43.01 |
| 2013/0177034 A1 * | 7/2013 | Liu et al. | 372/20 |

OTHER PUBLICATIONS

Bukkems et al., "Optical Internetworking Forum: Micro Integrable Tunable Laser Assembly Implementation Agreement," The Optical Networking Forum, Fremont, CA, Sep. 20, 2011; 19 pgs.

* cited by examiner

*Primary Examiner* — Kinam Park

(57) ABSTRACT

A laser assembly and a method for manufacturing the same are provided according to embodiments of the present disclosure. The laser assembly (900) may comprise a first plate (903) having first projections (918, 928); a printed circuit board assembly (902) including a printed circuit board (912) having first openings (913, 915) and a laser module (100) thereon, and a second plate (901) having second projections (917, 927). The printed circuit board assembly (902) can be retained between the first plate (903) and the second plate (901) by the first projections (918, 928) and the second projections (917, 927). The laser assembly may further comprises a first pad (930) provided between the laser module (100) and the first plate (903) and/or a second pad (920) provided between the laser module (100) and the second plate (901). Any of the first pad (930) and the second pad (920) may be adaptable to be compressed, and adaptable to hold the laser module (100) or to hold the laser module (100) and to dissipate the heat from the laser module (100).

24 Claims, 2 Drawing Sheets

LASER ASSEMBLY AND METHOD FOR MANUFACTURING THE SAME

BACKGROUND OF THE INVENTION

1. Field of the Invention

The present invention relates to laser assembly and method for manufacturing the same, particularly, to micro (small-size) integratable tunable laser assembly and method for manufacturing the same.

2. Description of the Related Art

Laser assembly is well known in the related art. Optical Internetworking Forum (OIF) has released an Integratable Tunable Laser Assembly (ITLA) Multi Source Agreement (OIF-ITLA-MSA-01.0, 2004) which defines numerous specifications for ITLA, including electric specifications, optical specifications, mechanical specifications, and the like.

As the developing and deploying of the optical internetworking technologies, there is a need to decrease the factor form of ITLA while still achieving the full function of the Printed Board Assembly of ITLA, that is to say, fulfilling the specifications defined in the OIF-ITLA-MSA-01.0 except the mechanical specifications.

SUMMARY

According to an aspect of the present disclosure, there is provided a laser assembly 900 which may comprise: a first plate 903 having first projections 918, 928; a printed circuit board assembly 902 including a printed circuit board 912 and a laser module 100 being mounted to the printed circuit board 912, and the printed circuit board 912 having first openings 913, 915; and a second plate 901 having second projections 917, 927, wherein the first openings 913, 915 are corresponding to the respective first projections and the respective second projections, and wherein the printed circuit board assembly 902 is adaptable to be retained between the first plate 903 and the second plate 901 by the first projections and the second projections in the case that the first plate 903 and the second plate 901 are secured to each other. Each of the first projections may include a first mounting through-hole 908. Each of the second projections may include a second mounting through-hole 907. And, each of the second through-holes 907 may be aligned with a first mounting through-hole 908. The first openings 913, 915 may be aligned with the respective first mounting through-holes and the respective second mounting through-holes.

In an embodiment, the laser assembly further comprises: a first pad 930 provided between the laser module 100 and the first plate 903; and/or a second pad 920 provided between the laser module 100 and the second plate 901, wherein any of the first pad 930 and the second pad 920 is adaptable to be compressed, and adaptable to hold the laser module 100 or to hold the laser module 100 and to dissipate the heat from the laser module 100.

In another embodiment, the laser module is mounted to the printed circuit board in a non-flexible manner. In a further embodiment, the laser assembly further comprises a retention screw 904 adaptable to be screwed into at least one of the respective first mounting through-hole 908 and the respective second mounting through-hole 907, which has screw threads on the wall thereof, to secure the first plate 903 and the second plate 901. In an preferred embodiment, the retention screw 904 includes a third mounting through-hole so that the laser assembly is adaptable to be mounted to an external object 911 through the third mounting through-hole of the retention screw.

According to another aspect of the present disclosure, there is provided a method for manufacturing a laser assembly 900, which may comprises: providing a first plate 903 having first projections 918, 928; providing a printed circuit board assembly 902 including a printed circuit board 912 and a laser module 100 being mounted to the printed circuit board 912, and the printed circuit board 912 having first openings 913, 915; providing a second plate 901 having second projections 917, 927, wherein the first openings 913, 915 are corresponding to the respective first projections and the respective second projections; and securing the first plate 903 and the second plate 901 to each other so that the printed circuit board assembly 902 is retained between the first plate 903 and the second plate 901 by the first projections and the second projections.

In an embodiment, the method may further comprise, before the securing: providing a first pad 930 between the laser module 100 and the first plate 903 and; and/or providing a second pad 920 between the laser module 100 and the second plate 901, and applying a force to the first plate and the second plate to compress the first pad and/or the second pad, wherein at least one of the first pad and the second pad is adaptable to hold the laser module (100) and/or to hold the laser module (100) and to dissipate the heat from the laser module.

In another embodiment, the securing may further comprise: screwing the retention screw 904 into at least one of the respective first mounting through-hole 908 and the respective second mounting through-hole 907, which has screw threads on the wall thereof, to secure the first plate 903 and the second plate 901.

Further aspects, features and advantages of the present invention will be understood from the following description with reference to the drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Figure 1:
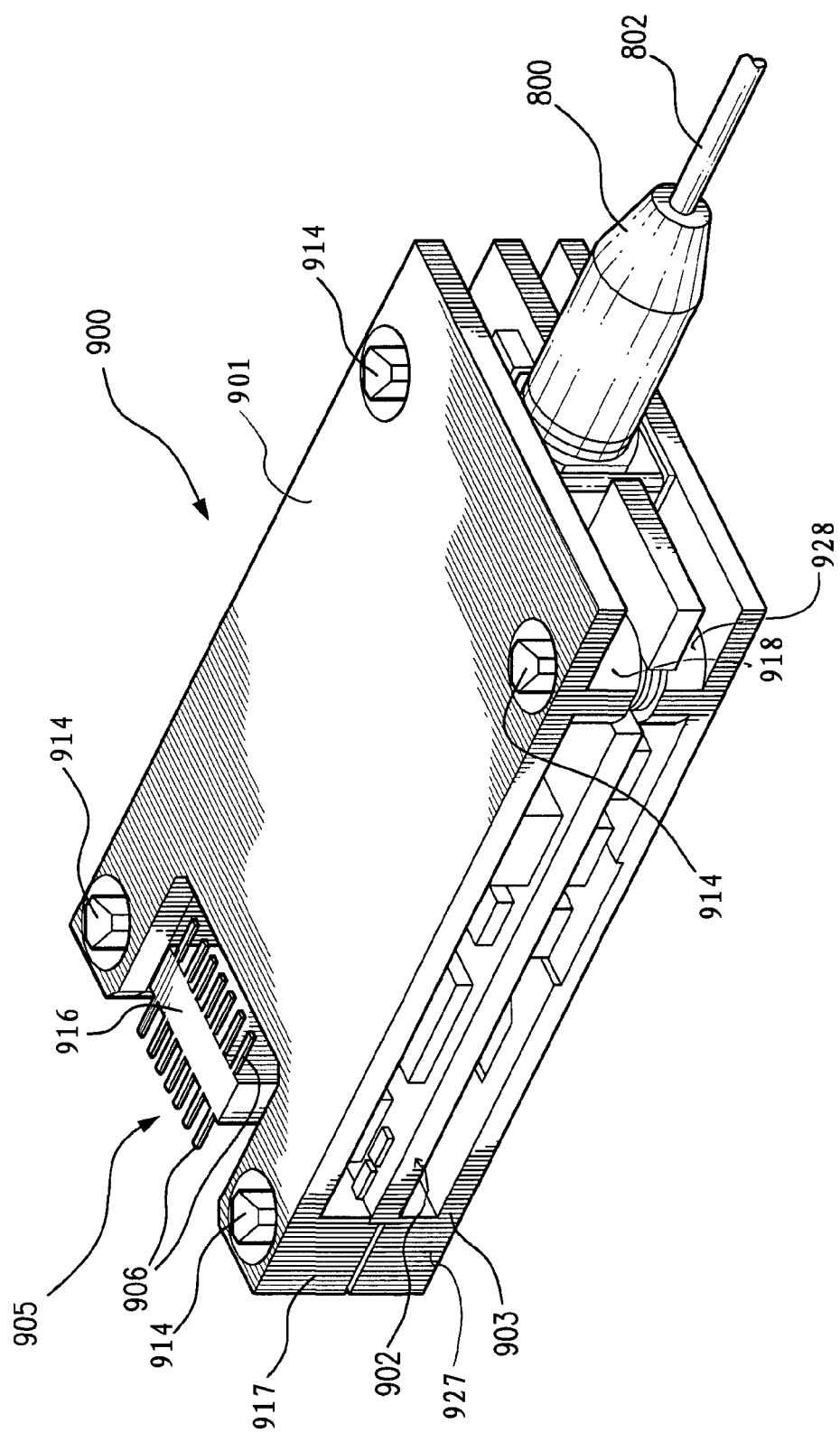
FIG. 1 is a prospective view schematically illustrating an embodiment of a laser assembly according to an embodiment of the present disclosure.

Embodiments of the present disclosure will be described in detail below with reference to the drawings. Note that similar reference numerals are used to refer to similar elements throughout the drawings, and thus repetitive descriptions thereof are omitted.

FIG. 1 is a prospective view schematically illustrating an embodiment of a laser assembly 900 according to an embodiment of the present disclosure. The assembly 900 comprises a first plate 903, a second plate 901, and a printed circuit board assembly (PBA) 902 which is adaptable to be retained between the first plate 903 and the second plate 901. In the embodiment illustrated in FIG. 1, the first plate 903 may be referred to as base plate, the second plate may be referred to as top retention plate, and the printed circuit board assembly 902 is placed over the base plate and beneath the top retention plate 901. Although the first plate 903 is illustrated as base plate in FIG. 1, the present invention is not limited thereto. For example, the first plate 903 can serve as a base plate, whereas the second plate 901 can serve as a retention plate.

Further, any of the plates 901 and 903 can be used to dissipate the heat generated from the printed circuit board assembly 902, for example, from a laser module in the PBA 902; and, in such a case, the plate can be referred to as thermal plate. In some examples, the plate(s) may be formed from, for example, metal such as aluminium (Al), copper (Cu), silver (Ag), or alloy of multiple metal elements, although other materials can be used as long as they are sufficiently firm and, in some cases, of high heat conductivity.

In an embodiment of this embodiment, the top retention plate 901 may be substantially rectangular in shape with a length of approximately 37 mm or less and a width of approximately 20 mm or less in dimension. Correspondingly, the base plate 903 may also be of the same dimensions as the retention plate.

Figure 2:
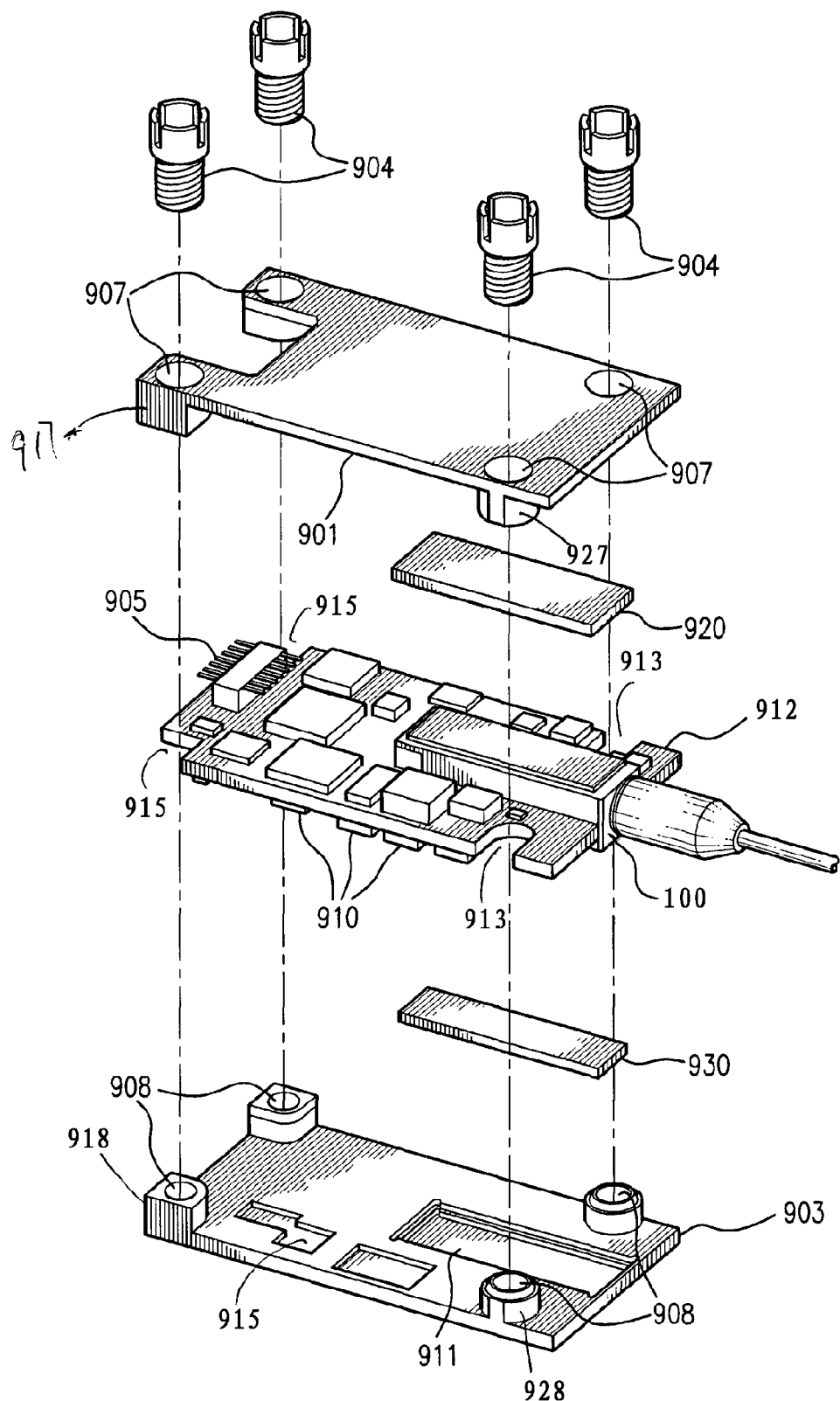
FIG. 2 schematically illustrates an explored prospective view of another embodiment of the laser assembly according to the present disclosure.

The first plate 903 may have multiple first projections 918, 928 (FIG. 2), and in this embodiment, four (4) first projections are illustrated. Each of the first projections may have a first mounting through-hole 908. Similarly, the second plate 901 may have multiple (for example, four) second projections 917, 927 (FIG. 2). In some preferred implementations, each of the second through-holes 907 is aligned with a first mounting through-hole 908. Each of the second projections may have a second mounting through-hole 907. The base plate (first plate) 903 and the top retention plate (second plate) 901 can be secured together.

As illustrated in the drawings, the printed circuit board assembly 902 is adaptable to be retained between the first plate 903 and the second plate 901 by the first projections 918, 928 and the second projections 917, 927 in the case that the first plate 903 and the second plate 901 are secured to each other. Whereas, typically posts are used for PBA retention only in the related art.

In an implementation, the printed circuit board assembly 902 includes a printed circuit board (PCB) 912 and a laser module 100 which is mounted to the printed circuit board 912. The PBA 902 may further include various other components 910, including electric components and/or optical components, etc. mounted onto the PCB 912. The printed circuit board 912 preferably is a dual-sided printed circuit board. That is to say, those components can be mounted onto double sides of the PCB and connected to the traces or pads on the bother sides, resulting in significant reduction in size of the PCB.

As illustrated in FIG. 1, the printed circuit board 912 may have first openings 913, 915 corresponding to the respective first projections 918, 928 and the respective second projections 917, 927, which can be better seen in FIG. 2.

An electrical connector 905 can also be provided on the printed circuit board 912. With the electrical connector 905, the printed circuit board assembly 902 can be electrically connected to external device, for example, CPU or other processing device, so as to receive or transmit information including command, data, etc. In this embodiment, the connector 905 is illustrated as being amounted on a surface of the PCB 912 and including an insulating base part 916 and terminals 906 extending outward from the base part 916. However, it is to be noted that various connector can be employed in the present invention. For example, connectors can be deployed on both sides of the PCB. In a further embodiment, the base part of the connector can be disposed on a surface of the PCB with row(s) of terminals extending outwards and substantially perpendicularly to the side surface.

As illustrated in FIG. 1, the plate(s) facing the connector 905, or, to say, facing the surface of the PCB on which the connector 905 is amounted, may have a cut-out for exposing the connector 905 so as to facilitate the coupling of the connector to the counterpart (e.g., a female connector). In this embodiment, the second plate 901 is illustrated as having a cut-out for exposing the connector 905, by way of example.

In addition, the entire assembly 900 may be further mounted onto an external object, such as a support, a carrier, or a heat sink (not shown) which may be at a line card of a transmitter assembly, in various manner.

In an implementation, the outer side-surfaces of the first and second projections may be flushed with the corresponding side-surface of the first and second plate, respectively As shown in FIG. 1.

Further, as shown in FIG. 1, the laser module may further comprises a rubber bushing 800 and a optical fibre 802 extended through the bushing 800 and coupled to the laser, both of the bushing 800 and the fibre 802 can extend beyond the ends of the plates.

FIG. 2 schematically illustrates an explored prospective view of another embodiment of the laser assembly according to the present disclosure.

In this embodiment, a first pad 930 is further provided between the laser module 100 and the first plate 903, for example, over the top surface of the base plate 903 and beneath the laser module 100, as shown in the FIG. 2. Alternatively or additionally, a second pad 920 can be provided between the laser module 100 and the second plate 901, e.g., under the bottom surface of the top retention plate 901 and over the laser module 100, as shown in the FIG. 2, too.

In some cases, at least one of the first pad 930 and the second pad 920 can be compressed, and used to hold the laser module 100, or to hold the laser module 100 and to dissipate the heat from the laser module 100. In this regard, the first/second pad may also be referred to as retention and/or thermal pad. In such a case, the thermal pad may preferably be in close contact with the first or second plate. Also, in some cases, the first pad 930 and the second pad 920 can be inter-exchanged with each other. In a preferred embodiment, out of the first pad and the second pad, the one to be disposed over the laser module 100 may have a frame-like shape with an inner cut-out, that is, there can be an inner cut-out in the pad, to release the pressure impact to the cap of the laser module, resulting in improved reliability. For example, the central part of the pad to be disposed over the laser module 100 can be removed.

The first/second pad can be formed from a compressive material, such as compressive foam, compressive patty, or the like. In some embodiments, the thermal pad may have a thermal conductivity of about 7 W/mk or higher, although other values may be specified for different operational requirements. In a specific example, the laser module 100 can be TTX3 laser module, for which heat generated from the laser module will be dissipated from the bottom rather than top of the module. Accordingly, a thermal pad is used as the pad 930, whereas a retention pad can be used as the pad 920.

Further, the shape of the first/second pad can be various, depending on the shape of the laser module to be retained, although it is shown as a rectangle in this embodiment.

In some embodiments, at least one of the first plate 903 and the second plate 901 may have a recess 911, as shown in FIG. 2, for at least partly receiving the first pad or the second pad. Other recesses 915 are also shown, for at least partly receiving the components mounted on the PCB 912, if desired.

In a preferred embodiment, depth of the recess 911 can be less than the height of the first pad or the second pad to be at least partly received in the recess (911), prior to the compressing of the corresponding pad. In such a case, the laser module 100 can be supported by a surface of one out of the first plate 903 and the second plate 901 which corresponds to the recess (911), and in close contact with one out of the first pad 930 and the second pad 920 which is compressed into the recess 911, after the securing.

In another preferred embodiment, the recess 911 may comprise a first cavity and a second cavity over and adjoined to the first cavity, in which the second cavity may have in-plane dimensions larger than those of the first cavity so that a step is formed at side surfaces of the recess 911. In such an embodiment, depth of the recess 911 may be less than height of the first cavity of the corresponding one out of the first pad and the second pad, prior to being compressed. The laser module 100 can be fitted in the second cavity and supported by the step of the recess 911, and in close contact with corresponding one out of the first pad and the second pad to the recess 911, which is compressed into the first cavity of the recess 911, after the securing.

As can be seen from FIG. 2, each of the first projections 918, 928 may include a first mounting through-hole 908, each of the second projections 917, 927 may include a second mounting through-hole 907, and each of the second through-holes 907 may be aligned with a first mounting through-hole 908. The first openings 913, 915 in the PCB may be aligned with the respective first mounting through-holes and the respective second mounting through-holes, as shown.

Further, as shown in FIG. 2, the laser assembly 900 may further comprise a retention screw 904 adaptable to be screwed into at least one of the respective first mounting through-hole 908 and the respective second mounting through-hole 907, which has screw threads on the wall thereof, to secure the first plate 903 and the second plate 901. Here, the retention screw may be formed from, for example, metal such as aluminium. Needless to say, the number of the screws 904 may be corresponding to the number of the first or second mounting holes 908 or 907. In an example of this implementation, the mounting through-hole 908 of the base plate has threads on the inner surface thereof so that the retention screw 904 can be screwed into (and thus, engaged with) the mounting through-hole 908. In a further example, alternatively or additionally, the mounting through-hole 907 of the top retention plate may have threads on the inner surface thereof so that the retention screw 904 can be screwed thereto.

In some preferred embodiment, the retention screw 904 can be hollowed, that is, includes a third mounting through-hole, so that the laser assembly 900 can be mounted to an external object through the third mounting through-hole of the retention screw, as illustrated in FIG. 1. In an example, the third mounting through-hole may have no threads on the inner surface thereof, and an end-user screw may extending through the third mounting through-hole and be screwed into, for example, a mounting hole in an external heatsink.

In some implementations, the retention screw 904 may include a first (upper) portion, and a second (lower) portion having threads on an outer-surface thereof, and the first portion may have an outer diameter greater than that of the second portion. The third mounting through-hole penetrates the first portion and the second portion, longitudinally. Correspondingly, the first mounting through-hole 907 may include a first portion and a second portion, the first portion having a inner diameter greater than that of the second portion, so that the first portion of the retention screw 904 can be seated on the second portion of the first mounting through-hole 907 in the case that the first plate 903 and the second plate 901 are screwed by the retention screw 904. It may be desirable that the length (height) of the first portion of the first mounting through-hole 907 along the longitudinal axis thereof may be equal to or larger than the length (height) of the first portion of the screw 904 along the longitudinal axis thereof, so that the retention screw would not project out from the corresponding mounting through-holes. In a preferred embodiment, the retention screw 904 may include an upper portion having an inner surface of which an inner diameter is decreased from top to bottom. That is, the retention screw 904 may have an inclined inner surface in the first portion. Thus, the end-user screw/post can be fitted in the third mounting through-hole with the top of the end-user screw/post disposed flush with or below the top surface of the assembly. The retention screw 904 may further include slits extending downward from the top of the retention screw 904 and partly through the retention screw 904. The slits may facilitate the mounting of the screws.

It need to be noted that the first openings 913, 915 can be set at the positions which otherwise were used for retention hole for the PCB, as defined by the OIF-ITLA-MSA. Thus, the impact to the area of the PCB can be minimized.

Further, as can be seen from FIG. 2, the printed circuit board 912 has a second opening (cut-out) for holding the laser module 100 in the second opening, allowing the laser 100 to be mounted to the board. The second opening may preferably be formed along a symmetry axis of the printed circuit board 902, as illustrated. The width of the second opening may be approximately equal to or slightly greater than the width of the laser module 100.

In an embodiment, the laser module 100 is interconnected to the PCB 912 in a no-flex (non-flexible) manner. The top electrical pins of the laser module 100 can be soldered to traces or pads on the top side of the printed circuit board 912, and the bottom electrical pins of the laser module 100 can be soldered to traces or pads on the bottom side of the printed circuit board 902. As compared with the related art in which the golden box of the tunable laser module (TTX3, in this example) is typically retained by a separate clip to base heatsink, the impact to the usable area of the PCB can be minimized.

Moreover, at least a part of the first projections and the corresponding second projections are, respectively, arranged in proximity of edges of, or at corners of, the first plate 903 and the second plate 901. As shown, the first projections 917 and the second projections 918 are arranged at corners of the first plate 903 and the second plate 901, while the first projections 927 and the second projections 928 are arranged in proximity of edges. Those skilled in the art will readily appreciate that the projections can be arranged as needed, although being arranged at corners may be preferable.

In some further implementations, a first plurality of the first projections 917, and corresponding second projections 927 thereof, each are posts with a section view of substantial rectangle a corner of which is rounded, and a second plurality of the first projections 918, and corresponding second projections 928 thereof, each are posts including first parts and second parts adjoined to the first parts, wherein each of the second parts has a dimension less than that of the respective first part. In the example illustrated in FIG. 2, there are four first projections and four second projections. Some (two) of the four first projections, 917, each are posts with a section view of substantial rectangle a corner of which is rounded, and other two, 927, each are posts including first parts and second parts, the first part being a cylinder while the second part being a truncated taper. Similarly, some (two) of the four second projections, 918, each are posts with a section view of substantial rectangle a corner of which is rounded, and other two, 928, each are posts including first parts and second parts, the first part being a cylinder while the second part being a truncated taper.

It is to be noted that there is no particular limitation on the shapes and sizes of the openings, as long as the retention screw 904 can pass through. In a specific example as illustrated in FIG. 2, at least a part of the first openings, 915 and/or 913, are formed so that at least a portion of the side surfaces of the first openings are close to or in contact with the corresponding first projections 917 and the corresponding second projections 927 in the case that the first plate 903 and the second plate 901 are secured. However, As far, a laser assembly with small factor form is provided according to the present invention, with full functions of PBA of ITLA. Meanwhile, the impact to PBA is minimized for maximum PBA area. That is, a micro ITLA is provided according to the present invention. Further, according to the present invention, the laser module and the PBA can be secured at defined position, and have tolerance minimized to create a minimum gap between the pins of the laser module and the PCB.

Further, as above-mentioned, a pressure-defined assembling process is employed to ensure the reliability of the no-flex TTX3/PBA interconnecting in the micro ITLA.

According to another aspect of the present invention, a method for manufacturing a laser assembly is provided. A first plate 903 having first projections 918, 928 is provided. A printed circuit board assembly 902 is provided, including a printed circuit board 912 and a laser module 100 being mounted to the printed circuit board 912, and the printed circuit board 912 has first openings 913, 915. Then, a second plate 901 having second projections 917, 927 is provided. The first openings 913, 915 may be corresponding to the respective first projections and the respective second projections. And the, the first plate 903 and the second plate 901 are secured to each other so that the printed circuit board assembly 902 is retained between the first plate 903 and the second plate 901 by the first projections and the second projections.

The method may further comprise, before the securing: providing a first pad 930 between the laser module 100 and the first plate 903 and; and/or providing a second pad 920 between the laser module 100 and the second plate 901. As mentioned above, at least one of the first pad and the second pad is adaptable to hold the laser module, or to hold the laser module and to dissipate the heat from the laser module. Then, in a preferred embodiment, a force can be applied to the first plate and/or the second plate to compress the first pad and/or the second pad. At least one of the first plate 903 and the second plate 901 has a recess 911 for at least partly receiving the first pad or the second pad, the corresponding pad can be compressed into the recess 911.

In an embodiment, depth of the recess 911 may is less than the height of a corresponding pad out of the first pad and the second pad to be at least partly received in the recess 911 to be at least partly received in the recess 911, prior to the compressing of the corresponding pad. The laser module 100 can be supported by a surface of one out of the first plate and the second plate which corresponds to the recess 911, and in close contact with one out of the first pad and the second pad which is compressed into the recess 911, after the securing.

In another embodiment, the recess 911 may comprise a first cavity and a second cavity adjoined to the first cavity, the second cavity having in-plane dimensions larger than those of the first cavity so that a step is formed at side surfaces of the recess 911. The depth of the first cavity of the recess 911 may be less than height of a corresponding pad out of the first pad and the second pad to be at least partly received in the first cavity, prior to the compressing of the corresponding pad. In such a case, the laser module 100 can be fitted in the second cavity and supported by the step of the recess 911 of one out of the first plate and the second plate which corresponds to the recess 911, and in close contact with a corresponding one out of the first pad and the second pad, which is compressed into the first cavity of the recess 911, after the securing.

In a specific implementation, the securing may comprise screwing the retention screw 904 into at least one of the respective first mounting through-hole 908 and the respective second mounting through-hole 907, which has screw threads on the wall thereof, to secure the first plate 903 and the second plate 901.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present invention can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the invention.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

What is claimed is:

1. A laser assembly, comprising:
   a laser plate having first projections;
   a printed circuit board assembly including a printed circuit board and a laser module being mounted to the printed circuit board, and the printed circuit board having first openings; and
   a second plate having second projections,
   wherein the first openings are corresponding to the respective first projections and the respective second projections, and
   wherein the printed circuit board assembly is adaptable to be retained between the first plate and the second plate by the first projections and the second projections in the case that the first plate and the second plate are secured to each other.

2. The laser assembly according to claim 1, further comprising:
   a first pad provided between the laser module and the first plate; and/or
   a second pad provided between the laser module and the second plate,
   wherein any of the first pad and the second pad is adaptable to be compressed, and adaptable to hold the laser module or to hold the laser module and to dissipate the heat from the laser module.

3. The laser assembly according to claim 2,
   wherein one of the first pad and the second pad, which is disposed over the laser module, has a frame-like shape with a inner cut-out.

4. The laser assembly according to claim 2,
   wherein at least one of the first plate and the second plate has an recess for at least partly receiving the first pad or the second pad.

5. The laser assembly according to claim 4,
   wherein depth of the recess is less than the height of a corresponding pad out of the first pad and the second pad to be at least partly received in the recess, prior to the compressing of the corresponding pad, and
   wherein the laser module is adaptable to be supported by a surface of one out of the first plate and the second plate which corresponds to the recess, and in close contact with one out of the first pad and the second pad which is compressed into the recess, after the securing.

6. The laser assembly according to claim 4,
   wherein the recess comprises a first cavity and a second cavity over and adjoined to the first cavity, the second cavity having in-plane dimensions larger than those of the first cavity so that a step is formed at side surfaces of the recess,
   wherein depth of the first cavity of the recess is less than height of a corresponding one out of the first pad and the second pad to be at least partly received in the first cavity, prior to the compressing of the corresponding pad, and
   wherein the laser module is adaptable to be fitted in the second cavity and supported by the step of the recess, and in close contact with a corresponding one out of the first pad and the second pad which is compressed into the first cavity of the recess, after the securing.

7. The laser assembly according to claim 1,
   wherein the laser module is mounted to the printed circuit board in a non-flexible manner.

8. The laser assembly according to claim 1,
   wherein each of the first projections includes a first mounting through-hole, each of the second projections includes a second mounting through-hole, and each of the second through-holes being aligned with a first mounting through-hole,
   wherein the first openings are aligned with the respective first mounting through-holes and the respective second mounting through-holes, and
   the laser assembly further comprises:
   a retention screw adaptable to be screwed into at least one of the respective first mounting through-hole and the respective second mounting through-hole which, has screw threads on the wall thereof, to secure the first plate and the second plate.

9. The laser assembly according to claim 8,
   wherein the retention screw includes a third mounting through-hole so that the laser assembly is adaptable to be mounted to an external object through the third mounting through-hole of the retention screw.

10. The laser assembly according to claim 9,
    wherein the retention screw includes a first portion, and a second portion having threads on an outer-surface thereof, the first portion having an outer diameter greater than that of the second portion, and the third mounting through-hole penetrates the first portion and the second portion longitudinally, and
    wherein the first mounting through-hole includes a first portion and a second portion, the first portion having a inner diameter greater than that of the second portion, so that the first portion of the retention screw can be seated on the second portion of the first mounting through-hole in the case that the first plate and the second plate are screwed by the retention screw.

11. The laser assembly according to claim 8,
    wherein the retention screw includes a first portion having an inner surface of which an inner diameter is decreased from top to bottom.

12. The laser assembly according to claim 1, wherein at least a part of the first projections, and the corresponding second projections thereof, are respectively arranged in proximity of edges of, or at corners of, the first plate and the second plate.

13. The laser assembly according to claim 1,
    wherein the printed circuit board assembly further comprises an electric connector, and at least one of the first plate and the second plate has a cut-out for exposing the connector.

14. The laser assembly according to claim 1,
    wherein the first plate and/or the second plate are substantially rectangle in shape with a length of about 37 mm or less and a width of about 20 mm or less, and
    wherein the laser assembly has a height of about 8 mm or less.

15. The laser assembly according to claim 1,
    wherein the laser assembly is a micro integratable tunable laser assembly.

16. A method for manufacturing a laser assembly, comprising:
    providing a first plate having first projection;
    providing a printed circuit board assembly including a printed circuit board and a laser module being mounted to the printed circuit board, and the printed circuit board having first openings;
    providing a second plate having second projections, wherein the first openings are corresponding to the respective first projections and the respective second projections; and
    securing the first plate and the second plate to each other so that the printed circuit board assembly is retained between the first plate and the second plate by the first projections and the second projections.

17. The method according to claim 16, further comprising, before the securing:
providing a first pad between the laser module and the first plate; and/or
providing a second pad between the laser module and the second plate, and
applying a force to the first plate and the second plate to compress the first pad and/or the second pad,
wherein any of the first pad and the second pad is adaptable to hold the laser module and/or to hold the laser module and to dissipate the heat from the laser module.

18. The method according to claim 17,
wherein at least one of the first plate and the second plate has an recess for at least partly receiving the first pad or the second pad.

19. The method according to claim 18,
wherein depth of the recess is less than the height of a corresponding pad out of the first pad and the second pad to be at least partly received in the recess to be at least partly received in the recess, prior to the compressing of the corresponding pad, and
wherein the laser module is adaptable to be supported by a surface of one out of the first plate and the second plate which corresponds to the recess, and in close contact with one out of the first pad and the second pad which is compressed into the recess, after the securing.

20. The method according to claim 18,
wherein the recess comprises a first cavity and a second cavity over and adjoined to the first cavity, the second cavity having in-plane dimensions larger than those of the first cavity so that a step is formed at side surfaces of the recess,
wherein the depth of the first cavity of the recess is less than height of a corresponding pad out of the first pad and the second pad to be at least partly received in the first cavity, prior to the compressing of the corresponding pad, and
wherein the laser module is adaptable to be fitted in the second cavity and supported by the step of the recess, and in close contact with a corresponding one out of the first pad and the second pad, which is compressed into the first cavity of the recess, after the securing.

21. The method according to claim 16,
wherein the laser module is mounted to the printed circuit board in a no-flex manner.

22. The method according to claim 16,
wherein the first projections includes first mounting through-hole, each of the second projections includes second mounting through-hole, and each of the second through-holes being aligned with a first mounting through-hole (908), and
wherein the first openings are aligned with the respective first mounting through-holes and the respective second mounting through-holes, and
wherein the securing comprises:
screwing the retention screw into at least one of the respective first mounting through-hole and the respective second mounting through-hole, which has screw threads on the wall thereof, to secure the first plate and the second plate.

23. The method according to claim 22,
wherein the retention screw includes a third mounting through-hole so that the laser assembly is adaptable to be mounted to an external object through the third mounting through-hole of the retention screw.

24. The method according to claim 16,
wherein the laser assembly is a micro integratable tunable laser assembly.

* * * * *